(12) United States Patent
Yagi et al.

(10) Patent No.: US 6,872,951 B2
(45) Date of Patent: Mar. 29, 2005

(54) ELECTRON OPTICAL SYSTEM ARRAY, CHARGED-PARTICLE BEAM EXPOSURE APPARATUS USING THE SAME, AND DEVICE MANUFACTURING METHOD

(75) Inventors: Takayuki Yagi, Kanagawa (JP); Haruhito Ono, Kanagawa (JP); Yasuhiro Shimada, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 286 days.

(21) Appl. No.: 09/819,672

(22) Filed: Mar. 29, 2001

(65) Prior Publication Data

US 2002/0005491 A1 Jan. 17, 2002

(30) Foreign Application Priority Data

Mar. 31, 2000 (JP) ........................................ 2000-097127

(51) Int. Cl.[7] .............................................. H01J 37/304
(52) U.S. Cl. .............................. 250/396 R; 250/492.22
(58) Field of Search ........................ 250/396 R, 492.22, 250/492.23, 492.2

(56) References Cited

U.S. PATENT DOCUMENTS

| | | | |
|---|---|---|---|
| 4,200,794 A | * | 4/1980 | Newberry et al. ...... 250/396 R |
| 4,354,111 A | | 10/1982 | Williams et al. ........ 250/396 R |
| 4,419,182 A | | 12/1983 | Westerberg et al. ........ 156/644 |
| 4,419,580 A | | 12/1983 | Walker et al. ........... 250/396 R |
| 4,569,033 A | | 2/1986 | Collins et al. ............... 364/845 |
| 4,607,167 A | | 8/1986 | Petric ....................... 250/492.2 |
| 4,742,234 A | | 5/1988 | Feldman et al. ......... 250/492.2 |
| 5,105,089 A | | 4/1992 | Yamada .................... 250/492.2 |
| 5,121,234 A | | 6/1992 | Kucera ......................... 359/50 |
| 5,215,623 A | | 6/1993 | Takahashi et al. .......... 156/644 |
| 5,260,579 A | | 11/1993 | Yasuda et al. ............ 250/492.2 |

(Continued)

FOREIGN PATENT DOCUMENTS

| JP | 56-19402 | 5/1981 |
|---|---|---|
| JP | 6-44093 | 2/1994 |
| JP | 2001-126651 | 5/2001 |

OTHER PUBLICATIONS

"Sub–Nanometer Minature Electron Microscope", A.D. Feinerman, et al., Journal of Vacuum Science and Technology A, vol. 10, No. 4, Jul./Aug. 1992, 611–616.

"High Aspect Ratio Aligned Multilayer Microstructure Fabrication", K. Y. Lee, et al., Journal of Vacuum Science and Technology B, vol. 12, No. 6, Nov./Dec. 1994, pp. 3425–3430.

"Arrayed Miniature Electron Beam Columns For High Throughput Sub–100 nm Lithography", T. H. P. Chang, et al., Journal of Vacuum Science and Technology B, vol. 10, No. 6, Nov./Dec. 1992, pp. 2743–2748.

"Microstructures for Particle Beam Control", G. W. Jones, et al., Journal of Vacuum Science and Technology B, vol. 6, No. 6, Nov./Dec. 1988, pp. 2023–2027.

"A Multibeam Scheme for Electron–Beam Lithography", T. Sasaki, Journal of Vacuum Science and Technology, vol. 19, No. 4, Nov./Dec. 1981, pp. 963–965.

*Primary Examiner*—Kiet T. Nguyen
(74) *Attorney, Agent, or Firm*—Fitzpatrick, Cella, Harper & Scinto

(57) ABSTRACT

An electron optical system array has a plurality of electron lenses, the system array having at least two electrodes structures which respectively have membranes and are arranged along an optical axis, each of the membranes having a plurality of apertures through which charged-particle beams pass. There is also a spacer which is interposed between the facing membranes and adjacent to the aperture and which determines a gap between the facing membranes.

26 Claims, 17 Drawing Sheets

U.S. PATENT DOCUMENTS

| | | | |
|---|---|---|---|
| 5,324,930 A | 6/1994 | Jech, Jr. | 250/216 |
| 5,534,311 A | 7/1996 | Shaw et al. | 427/526 |
| 5,604,394 A | 2/1997 | Saito et al. | 313/422 |
| 5,617,131 A | 4/1997 | Murano et al. | 347/233 |
| 5,731,591 A | 3/1998 | Yamada et al. | 250/492.2 |
| 5,834,783 A | 11/1998 | Muraki et al. | 250/398 |
| 5,864,142 A | 1/1999 | Muraki et al. | 250/491.1 |
| 5,905,267 A | 5/1999 | Muraki | 250/492.22 |
| 5,929,454 A | 7/1999 | Muraki et al. | 250/491.1 |
| 5,939,725 A | 8/1999 | Muraki | 250/492.22 |
| 5,942,761 A | 8/1999 | Tuli | 250/556 |
| 5,973,332 A | 10/1999 | Muraki et al. | 250/492.2 |
| 5,981,954 A | 11/1999 | Muraki | 250/397 |
| 6,014,200 A | 1/2000 | Sogard et al. | 355/53 |
| 6,072,251 A | 6/2000 | Markle | 310/12 |
| 6,104,035 A | 8/2000 | Muraki | 250/492.22 |
| 6,107,636 A | 8/2000 | Muraki | 250/492.2 |
| 6,121,625 A | 9/2000 | Ito et al. | 250/492.22 |
| 6,137,103 A | 10/2000 | Giles et al. | 250/216 |
| 6,137,113 A | 10/2000 | Muraki | 250/492.22 |
| 6,166,387 A | 12/2000 | Muraki et al. | 250/492.2 |
| 6,184,850 B1 | 2/2001 | Suzuki et al. | 345/74 |
| 6,188,074 B1 | 2/2001 | Satoh et al. | 250/492.22 |
| 6,274,877 B1 | 8/2001 | Muraki | 250/492.23 |
| 6,323,499 B1 | 11/2001 | Muraki et al. | 250/492.22 |
| 6,337,485 B1 | 1/2002 | Muraki et al. | 250/492.2 |
| 6,381,072 B1 | 4/2002 | Burger | 359/622 |
| 6,381,702 B1 | 4/2002 | Ogasawara | 713/500 |
| 6,465,796 B1 | 10/2002 | Haraguchi et al. | 250/492.23 |
| 6,469,799 B1 | 10/2002 | Kajita | 358/1.16 |
| 6,472,672 B1 | 10/2002 | Muraki | 250/492.2 |
| 6,483,120 B1 | 11/2002 | Yui et al. | 250/491.1 |
| 6,515,409 B2 | 2/2003 | Muraki et al. | 313/359.1 |
| 6,566,664 B2 | 5/2003 | Muraki | 250/492.2 |
| 6,603,128 B2 | 8/2003 | Maehara et al. | 250/441.11 |
| 6,617,595 B1 | 9/2003 | Okunuki | 250/492.22 |
| 2002/0009901 A1 | 1/2002 | Maehara et al. | 438/795 |
| 2002/0160311 A1 | 10/2002 | Muraki et al. | 430/926 |
| 2002/0179855 A1 | 12/2002 | Muraki | 250/492.22 |
| 2003/0094584 A1 | 5/2003 | Yui et al. | 250/492.22 |
| 2003/0209673 A1 | 11/2003 | Ono et al. | 250/396 R |
| 2004/0061064 A1 | 4/2004 | Ono et al. | 250/396 R |

* cited by examiner

FIG. 15

```
URL  http://www.maintain.co.jp/db/input.html
TROUBLE DB INPUT WINDOW

OCCURRENCE DATE  [2000/3/15] ~4040
TYPE OF APPARATUS  [* * * * * * * * *] ~4010
SUBJECT  [OPERATING ERROR (START-UP ERROR)] ~4030
SERIAL NUMBER S/N  [465NS4580001] ~4020
DEGREE OF URGENCY  [D] ~4050
SYMPTOM   [LED IS KEPT FLICKERING AFTER
           POWER-ON]  ~4060

REMEDY    [POWER ON AGAIN
           (PRESS RED BUTTON IN ACTIVATION)]  ~4070

PROGRESS  [INTERIM HAS BEEN DONE]  ~4080

(SEND)(RESET)     4100              4110              4120
LINK TO RESULT LIST DATABASE   SOFTWARE LIBRARY   OPERATING GUIDE
```

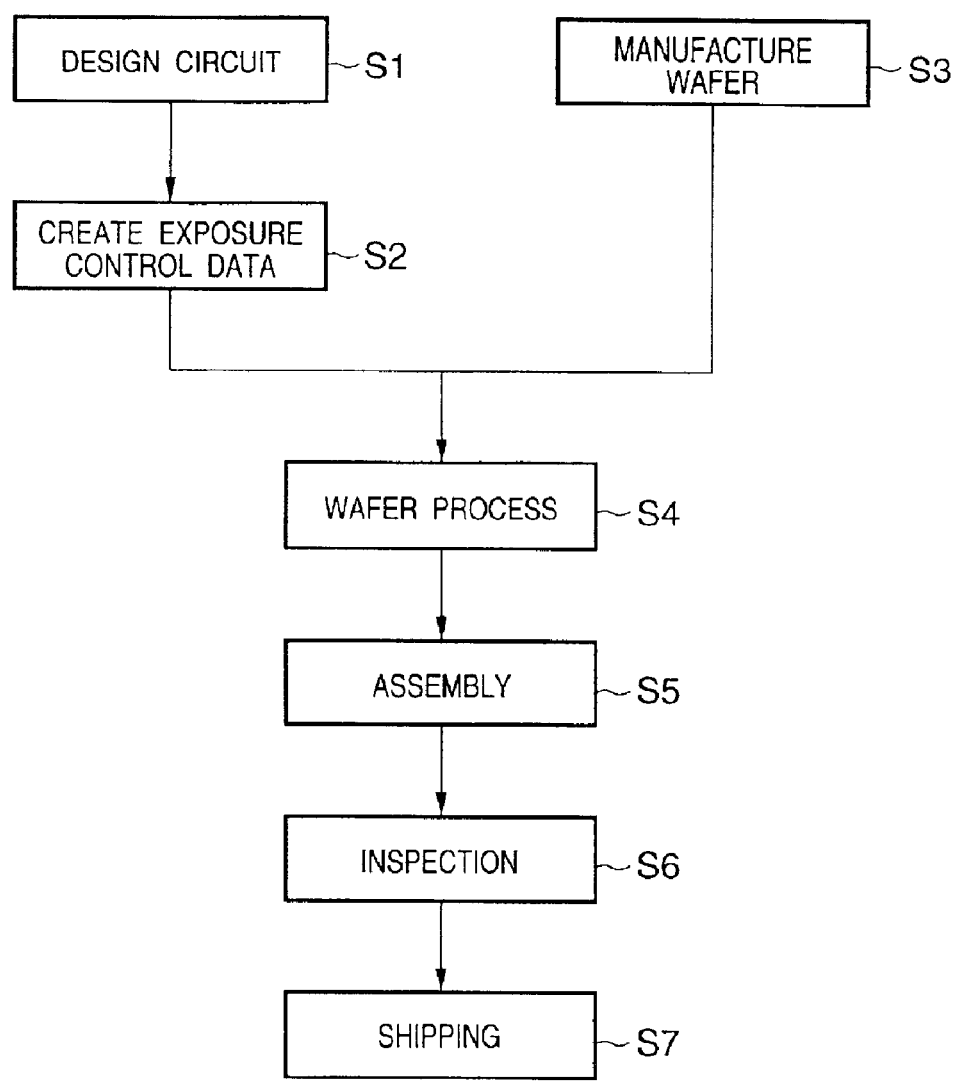

ELECTRON OPTICAL SYSTEM ARRAY, CHARGED-PARTICLE BEAM EXPOSURE APPARATUS USING THE SAME, AND DEVICE MANUFACTURING METHOD

FIELD OF THE INVENTION

The present invention pertains to the technical field of an electron optical system suitable for an exposure apparatus using charged-particle beams such as electron beams, and relates to an electron optical system array having an array of a plurality of electron optical systems.

BACKGROUND OF THE INVENTION

In production of semiconductor devices, an electron beam exposure technique receives a great deal of attention as a promising candidate of lithography capable of micro-pattern exposure at a line width of 0.1 μm or less. There are several electron beam exposure methods. An example is a variable rectangular beam method of drawing a pattern with one stroke. This method suffers many problems as a mass-production exposure apparatus because of a low throughput. To attain a high throughput, there is proposed a pattern projection method of reducing and transferring a pattern formed on a stencil mask. This method is advantageous to a simple repetitive pattern but disadvantageous to a random pattern such as a logic interconnection pattern in terms of the throughput, and a low productivity disables practical application.

To the contrary, a multi-beam system for drawing a pattern simultaneously with a plurality of electron beams without using any mask has been proposed and is very advantageous to practical use because of the absence of physical mask formation and exchange. What is important in using a multi-electron beams is the number of electron lenses formed in an array used in this system. The number of electron lenses determines the number of beams, and is a main factor which determines the throughput. Downsizing the electron lenses while improving the performance of them is one of the keys to improving the performance of the multi-beam exposure apparatus.

Electron lenses are classified into electromagnetic and electrostatic types. The electrostatic electron lens type does not require any coil core or the like, is simpler in structure than the electromagnetic electron lens type, and is more advantageous to downsizing. The principal prior art concerning downsizing of the electrostatic electron lens (electrostatic lens) will be described.

A. D. Feinerman et al. (J. Vac. Sci. Technol. AlO(4), p. 611, 1992) disclose a three-dimensional structure made up of three electrodes as a single electrostatic lens by a micromechanics technique using a V-groove formed by a fiber and Si crystal anisotropic etching. The Si film has a membrane frame, membrane, and aperture formed in the membrane so as to transmit an electron beam. K. Y. Lee et al. (J. Vac. Sci. Technol. B12(6), p. 3,425, 1994) disclose a multilayered structure of Si and Pyrex glass fabricated by using anodic bonding. This technique fabricates microcolumn electron lenses aligned at a high precision. Similar to the previous reference, this Si film also has a membrane frame, membrane, and aperture formed in the membrane.

As a method of arraying downsized electron lenses, several arrangements have been proposed. T. H. P. Chang et al. (J. Vac. Sci. Technol. B10 (6), p. 2,743, 1992) disclose an arrangement of units each formed from one small electrostatic lens. This arrangement requires the wiring line of each lens and the support of each unit, which increases the volume and inhibits an increase in the number of arrays. The electron beam exposure technique is applied to micro-pattern exposure at a line width of 0.1 μm or less. The positional precision of each unit must be suppressed to an error of 0.1 μm or less, which makes mounting and assembly difficult and leads to an increase in apparatus cost. In the use of a plurality of electron sources, the exposure amount varies owing to variations between the electron sources, and the resolution of a developed resist pattern varies in a plane.

According to another proposal, electron lenses are arrayed on one Si substrate whose periphery is fixed. G. W. Jones et al. (J. Vac. Sci. Technol. B6 (6), p. 2,023, 1988) propose electron lenses one-dimensionally aligned on an Si substrate. U.S. Pat. No. 4,419,580 proposes electron lenses two-dimensionally arrayed on an Si substrate. This arrangement has merits that only Si substrates having electrodes are aligned instead of aligning units, and that the number of arrays can be easily increased by arranging a plurality of electrodes for electron lenses on one substrate. However, this arrangement suffers the following problems.

(1) A stress is applied to a substrate having a plurality of apertures in supporting the substrate from its side surface, and the substrate may warp due to the stress. An excessively large stress may destruct a thin membrane portion having apertures. When the same voltage is applied to an array, a generated electrolytic potential differs depending on the position of a lens in the array owing to the warp, resulting in variations in lens performance.

(2) For example, in a single electrostatic lens, a voltage is applied to a central electrode (second electrode), the first electrode on the incident side and the third electrode on the beam exit side are grounded, and a convex lens is formed from a composite lens of concave, convex, and concave lenses. In this single electrostatic lens, the gaps between the central electrode and the first and third electrodes must be minimized to realize a high lens efficiency, i.e., short focal length. If the electrodes are set closer, the membrane may warp due to electrostatic attraction generated by an applied high voltage of several kV. A generated electrolytic potential changes depending on the position of a lens in the array owing to the warp, causing variations in lens performance.

(3) If the membrane warps, and the electrodes come closer, discharge readily occurs at a position where the distance between facing electrodes is the shortest. In the worst case, discharge may destruct the electrodes.

SUMMARY OF THE INVENTION

The present invention has been made to overcome the conventional drawbacks, and has as its principal object to provide an improvement of the prior arts. It is an object of the present invention to provide an electron optical system array which realizes various conditions such as downsizing, high precision, and high reliability at high level. It is another object of the present invention to provide an electron optical system array capable of forming at a high precision the gap between the electrodes constituting each electron lens of a substrate having a plurality of electron lenses in arraying the electron lenses, e.g., electrostatic lenses. It is still another object of the present invention to provide a high-precision exposure apparatus using the electron optical system, a high-productivity device manufacturing method, a semiconductor device production factory, and the like.

According to the first aspect of the present invention, there is provided an electron optical system array having a plurality of electron lenses, comprising at least two electrode structures which respectively include membranes and are arranged along an optical axis each of the membranes having a plurality of apertures through which charged-particle beams pass, and a spacer which is interposed between the facing membranes and adjacent to the aperture and which determines a gap between the facing membranes. According to a preferred mode of the present invention, the spacer includes an insulator, the spacer is made of photosensitive glass, or the spacer is arranged at a position where the spacer does not close the apertures of each membrane.

According to another preferred mode of the present invention, it is preferable that the spacer includes a plate having a plurality of apertures at positions corresponding to the plurality of apertures of each membrane, that the spacer include a plurality of columnar members, that the spacer include a plurality of linear members, or that the spacer include a plurality of members having apertures, and the plurality of members be arranged to make positions of the apertures of the plurality of members coincide with positions of the plurality of apertures of each membrane.

According to still another preferred mode of the present invention, at least one of at least two electrode structures preferably comprises a plurality of electrically independent wiring lines, and a plurality of electrode members connected to the plurality of wiring lines. At least the other one of at least two electrode structures preferably has a single electrode member common to the plurality of apertures.

According to still another preferred mode of the present invention, the electrode structures respectively have supports for supporting the membranes. In this case, the electron optical system array preferably further comprises a member which is interposed between the supports of the facing electrode structures and determines a gap between the facing supports. More specifically, it is preferable that the supports of the facing electrode structures respectively have grooves at facing positions, and the electron optical system array further comprise a fiber which is sandwiched between the facing grooves and defines a gap between the facing supports.

According to the second aspect of the present invention, there is provided an electron optical system array having a plurality of electron lenses, comprising, at least two electrode structures which respectively include membranes each having a plurality of apertures and are arranged along an optical axis, and a plurality of spacers which are located in a gap of the facing membranes and determine the gap at a plurality of positions of the facing membranes.

According to another preferred mode of the present invention, it is preferable that each of said plurality of spacers includes a columnar member or a linear member, or that each of said plurality of spacers has dice or cylindrical shape.

According to the second aspect of the present invention, there is provided a charged-particle beam exposure apparatus comprising a charged-particle beam source for emitting a charged-particle beam, an electron optical system array which has a plurality of electron lenses and forms a plurality of intermediate images of the charged-particle beam source by the plurality of electron lenses, and a projection electron optical system for projecting on a substrate the plurality of intermediate images formed by the electron optical system array, the electron optical system array including at least two electrode structures which respectively include membranes each having a plurality of apertures and are arranged along an optical axis, and a spacer which is interposed between the facing membranes and determines a gap between the facing membranes.

According to the third aspect of the present invention, there is provided a device manufacturing method comprising the steps of installing a plurality of semiconductor manufacturing apparatuses including the charged-particle beam exposure apparatus defined in the second aspect in a factory, and manufacturing a semiconductor device by using the plurality of semiconductor manufacturing apparatuses. According to a preferred mode of the present invention, this manufacturing method preferably further comprises the steps of connecting the plurality of semiconductor manufacturing apparatuses by a local area network, connecting the local area network to an external network of the factory, acquiring information about the charged-particle beam exposure apparatus from a database on the external network by using the local area network and the external network, and controlling the charged-particle beam exposure apparatus on the basis of the acquired information.

According to the fourth aspect of the present invention, there is provided a semiconductor manufacturing factory comprising a plurality of semiconductor manufacturing apparatuses including the charged-particle beam exposure apparatus defined in the second aspect, a local area network for connecting the plurality of semiconductor manufacturing apparatuses, and a gateway for connecting the local area network to an external network of the semiconductor manufacturing factory.

According to the fifth aspect of the present invention, there is provided a maintenance method for a charged-particle beam exposure apparatus, comprising the steps of preparing a database for storing information about maintenance of the charged-particle beam exposure apparatus on an external network of a factory where the charged-particle beam exposure apparatus defined in the second aspect is installed, connecting the charged-particle beam exposure apparatus to a local area network in the factory, and maintaining the charged-particle beam exposure apparatus on the basis of the information stored in the database by using the external network and the local area network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 15 is a view showing a user interface on a display;

FIG. 16 is a flow chart for explaining the flow of a semiconductor device manufacturing process.

DETAILED DESCRIPTION OF THE PREFERRED EMBODIMENTS

Preferred embodiments of the present invention will be described below.

Figure 1:
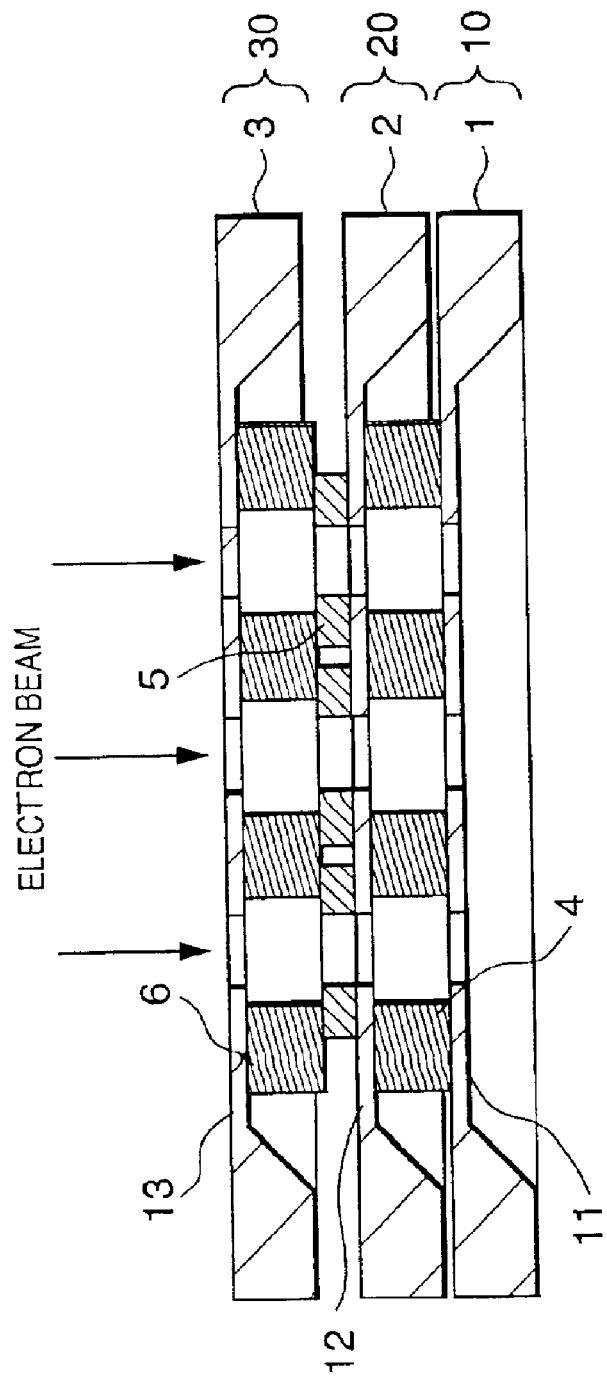
FIG. 1 is a sectional view for explaining the structure of an electron optical system array.
Figure 2:
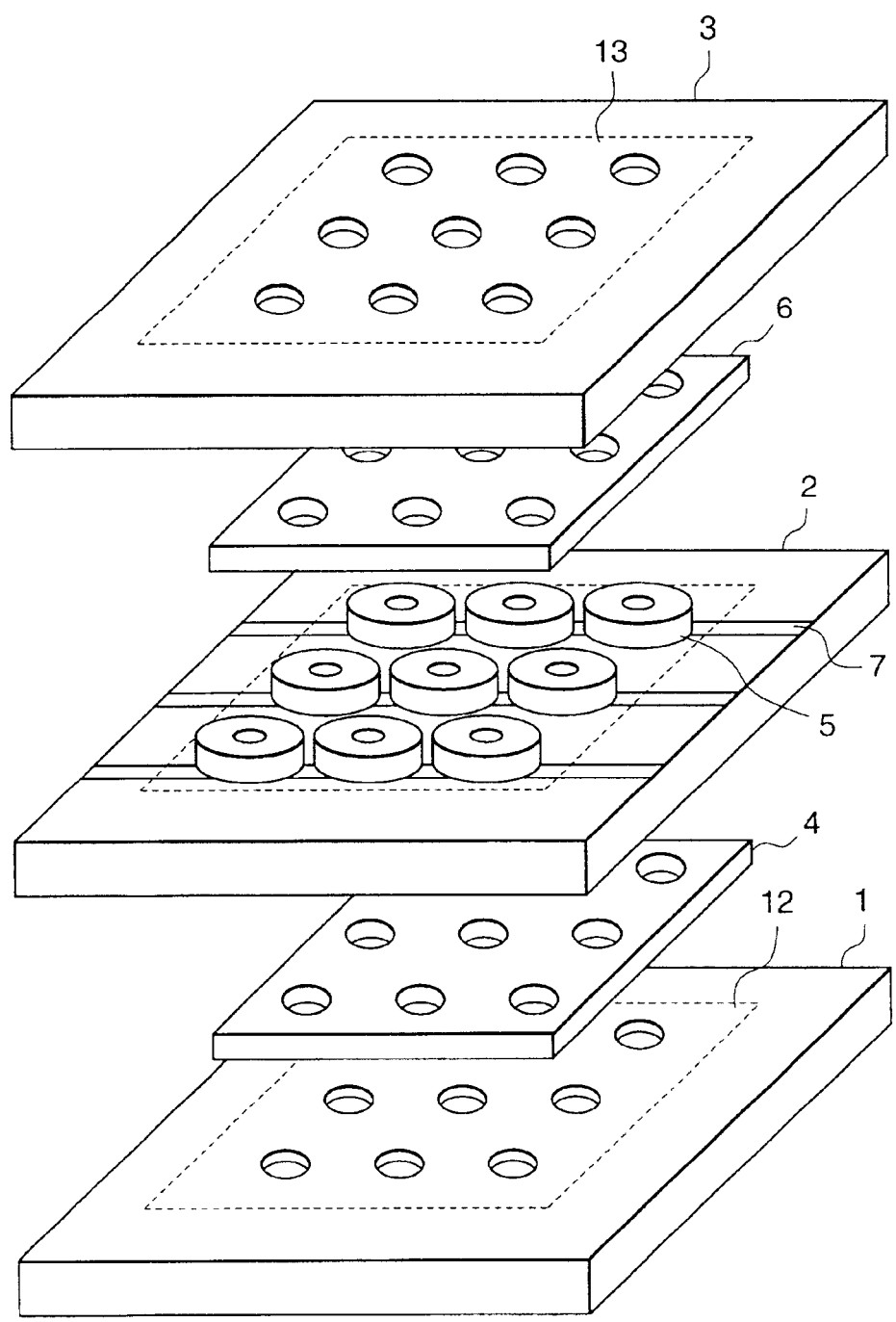
FIG. 2 is a perspective view for explaining the structure of the electron optical system array.

The first embodiment of an electron optical system array will be explained with reference to the accompanying drawings. FIG. 1 is a schematic sectional view showing an electron optical system array according to a preferred embodiment of the present invention. FIG. 2 is a perspective view for explaining the arrangement of three electrode structures and spacers constituting the electron optical system array in FIG. 1. The electron optical system array comprises upper, middle, and lower electrode structures 30, 20, and 10. The electrode structures 10, 20, and 30 respectively have supports 1, 2, and 3, and membranes 11, 12, and 13 having apertures. The upper and lower electrode structures 30 and 10 respectively have single conductors. The middle electrode structure 20 has a plurality of separate electrode members 5 so as to individually adjust the focal lengths of electron lenses in units of separate electrode members 5. As shown in FIG. 2, wiring lines 7 are formed to adjust the potentials of the electrode members 5 in units of groups or one by one. In the example of FIG. 2, the wiring lines 7 are laid out, and electron lenses connected to a common wiring line 7 have the same lens curvature. Spacers 4 and 6 are interposed between the facing membranes of the electrode structures. Even when the gaps between the supports 1, 2, and 3 of the membranes shift in the staking direction in a combination of a plurality of electrodes constituting an electron lens, the gaps between the membranes 11, 12, and 13 do not depend on the shift because the spacers are arranged in addition to the supports. Hence, the flatness of the electrode structures constituting an electron optical system array is determined by the spacers 4 and 6 respectively interposed between the membranes 11, 12, and 13. This can prevent the membranes 11, 12, and 13 from warping due to a stress applied to the membranes 11, 12, and 13 having a plurality of apertures when the supports of the membranes are fixed in an electron beam exposure apparatus. Even if the membranes 11, 12, and 13 formed from electrode layers warp owing to the internal stresses of the thin films, the spacers 4 and 6 can determine the final distances between the membranes (electrode members). As a result, a generated electrolytic potential can be prevented from varying depending on the position of a lens in an array owing to flexure. Furthermore, discharge caused by an unsettled gap hardly occurs because the distance between the electrode members is constant in the membrane.

The spacer will be explained. As shown in FIG. 2, each spacer has a plate-like shape with a plurality of apertures. The spacer, which is interposed between the membranes of the electrode structures, cannot electrically connect the membranes. Since a high voltage of several kV is applied between electrodes in the lens, the spacer is desirably an insulator in order to increase the breakdown voltage. However, the spacer material is not limited to the insulator and may be a semiconductor or conductor as long as an insulating film is formed on the membrane and the spacer is placed on the insulating film.

Figure 3:
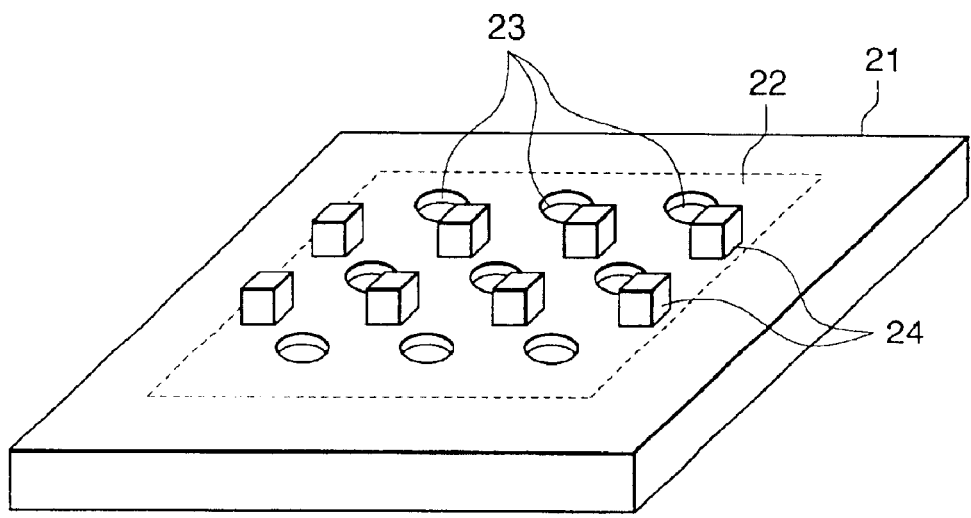
FIG. 3 is a perspective view for explaining another example of the spacer of the electron optical system array.
Figure 4:
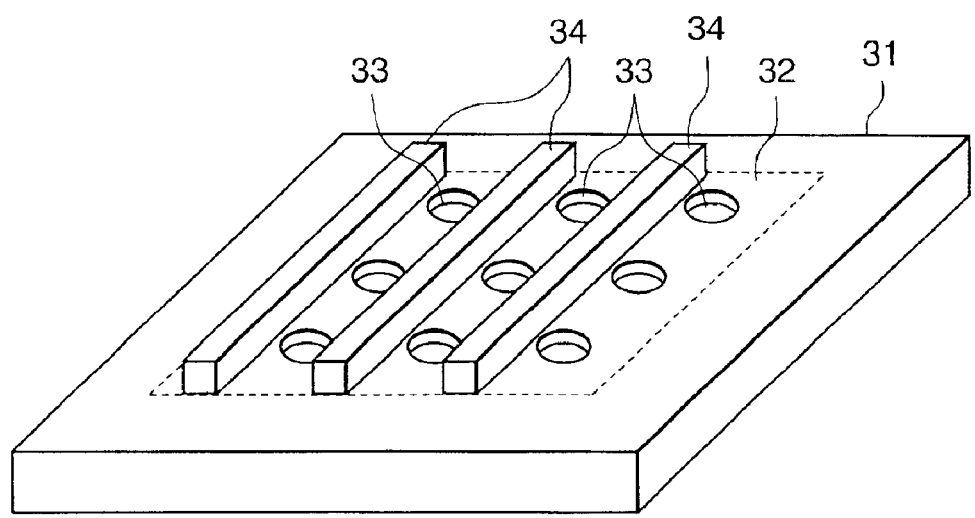
FIG. 4 is a perspective view for explaining still another example of the spacer of the electron optical system array.
Figure 5:
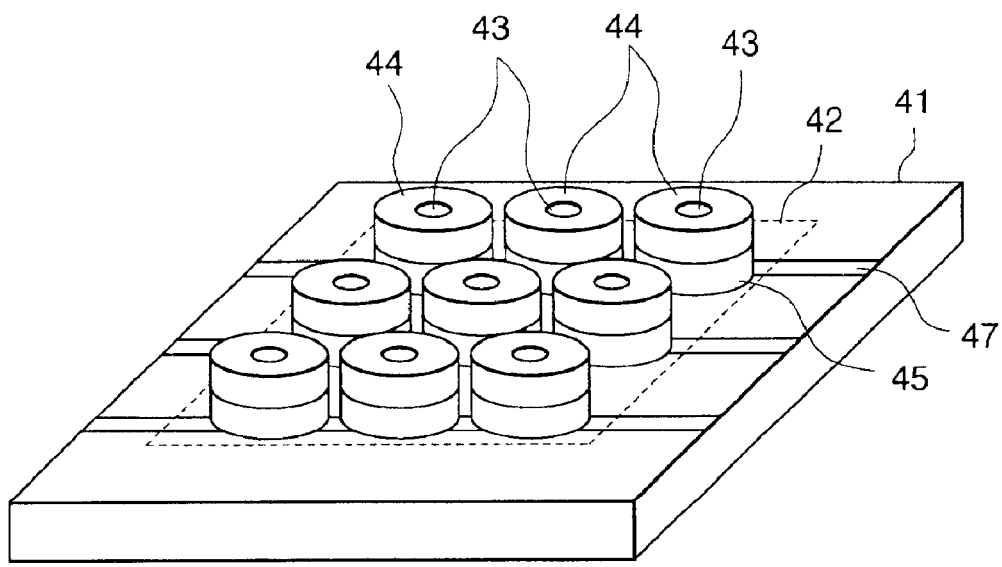
FIG. 5 is a perspective view for explaining still another example of the spacer of the electron optical system array.

Other examples of the form and arrangement of the spacer will be explained with reference to FIGS. 3, 4, and 5. FIG. 3 shows one example of the spacer. In FIG. 3, a plurality of columnar spacers 24 are arranged on a middle electrode structure comprised of a support 21 and a membrane 22 having a plurality of apertures 23. FIG. 4 shows another example of the spacer. In FIG. 4, a plurality of linear spacers 34 are arranged on a middle electrode structure made up of a support 31 and a membrane 32 having a plurality of apertures 33. FIG. 5 shows still another example of the spacer. In FIG. 5, a plurality of annular spacers 44 are arranged on a middle electrode structure constituted by a support 41, a membrane 42 having a plurality of apertures 43, wiring lines 47, and electrode members 45. These spacers 24, 34, 44 are preferably fabricated by, e.g., machining glass. By using photosensitive glass for the spacers, various shapes such as dice, linear, and cylindrical shapes can be easily attained by ultraviolet exposure and developing heating after the photosensitive glass is polished to a desired thickness. The spacers of these examples couple the membranes of electrodes at a plurality of points or via lines. Similar to the spacer shown in FIG. 1, the gap between the electrode members constituting the electron optical system array can be determined by the spacer interposed between the membranes, which prevents any warp of the substrate. As another method of forming a spacer, an insulating film with a desired thickness is formed on an electrode and patterned into a desired shape by a photolithography process and etching, thereby forming a spacer as shown in FIGS. 2 to 5 on a membrane. When a photosensitive resin is used as a spacer material, it is also possible to form a spacer by a photolithography process after the material is applied to a desired film thickness by a general coating method such as spin coating, dipping, or spraying.

Figure 6:
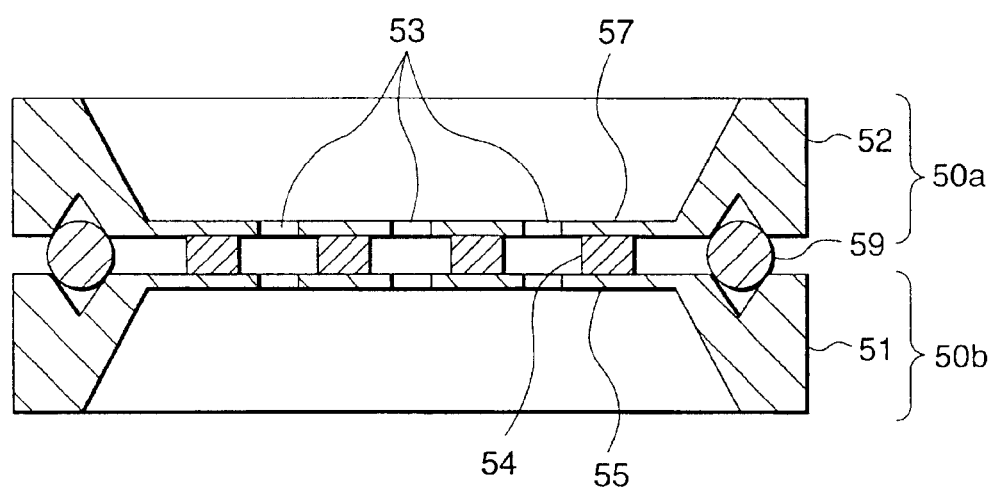
FIG. 6 is a sectional view for explaining another structure of the electron optical system array.

FIG. 6 shows an electron optical system array according to another embodiment. In this electron optical system array, upper and lower electrode structures 50a and 50b face each other along the optical axis. The gap between supports 51 and 52 of the lower and upper electrode structures 50b and 50a is determined by sandwiching a fiber 59 having a desired diameter between V-grooves formed in the two supports. The gap between membranes 55 and 57 is determined by inserting a spacer 54 between them. If silicon wafers are used as substrates for forming the electrode structures 50a and 50b, V-grooves can be formed at a high precision by anisotropic etching utilizing the difference in the etching rate of a silicon crystal face that is performed using an alkaline solution. This can make apertures 53 of the electrode structures 50a and 50b coincide with each other at a high precision.

Figure 7:
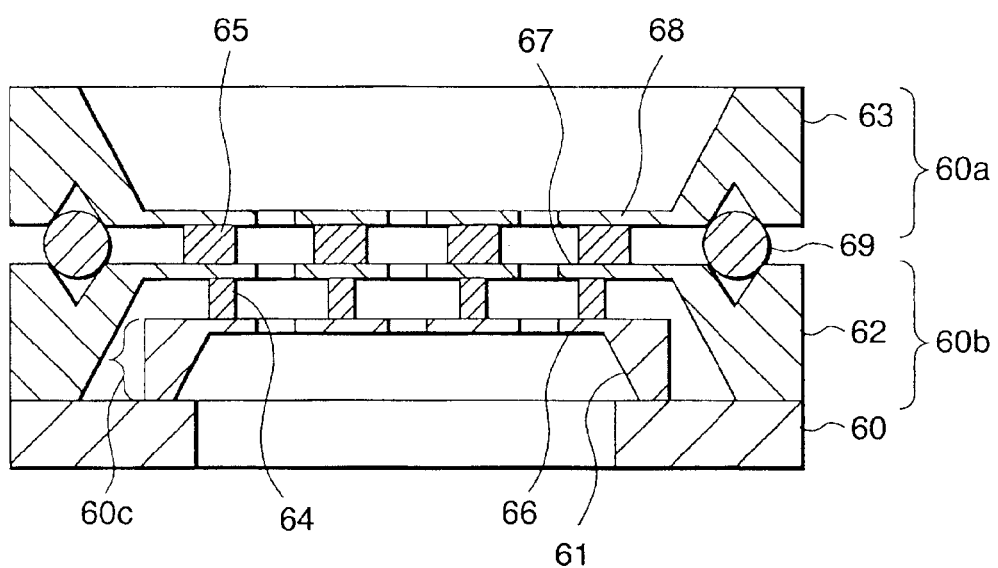
FIG. 7 is a sectional view for explaining still another structure of the electron optical system array.

FIG. 7 shows an electron optical system array according to still another embodiment. This electron optical system array is obtained by adding one more electrode structure to the electron optical system array shown in FIG. 6 and stacking three electrode structures 60a, 60b, and 60c along the optical axis. The lower electrode structure 60c is housed in the opening of the middle electrode structure 60b. The middle and lower electrode structures 60b and 60c are joined to a frame 60. The gap between membrane supports 62 and 63 of the upper and middle electrode structures 60a and 60b is determined by sandwiching a fiber 69 having a desired diameter between V-grooves formed in the two supports. The gaps between membranes 66, 67, and 68 are determined by inserting spacers 64 and 65 between them. The apertures of the spacers 65 and 64 need not be the same.

Figure 8A:
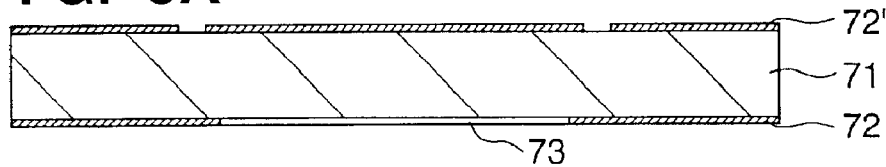
FIGS. 8A to 8F are sectional views for explaining the steps in fabricating an upper electrode.
Figure 8B:
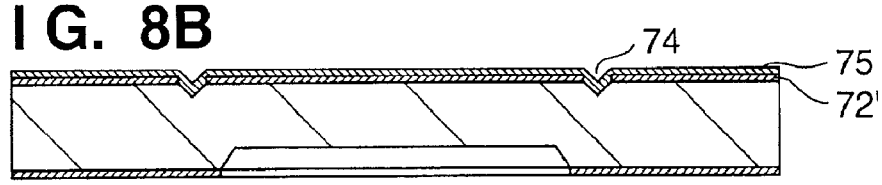
Figure 8C:
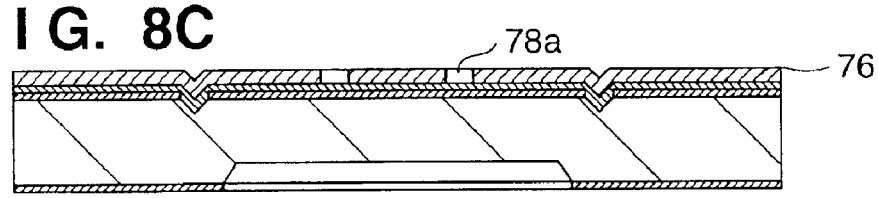
Figure 8D:
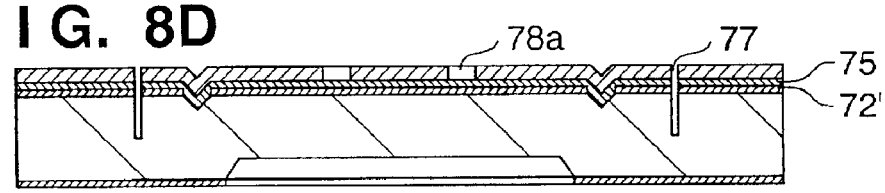
Figure 8E:
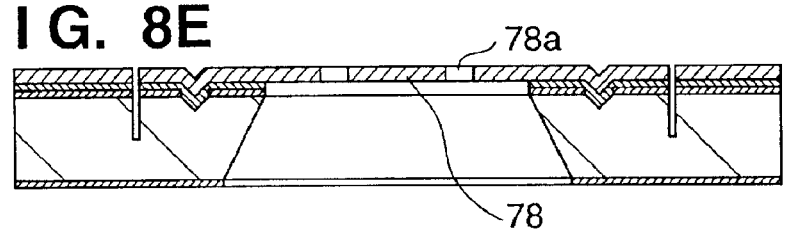
Figure 8F:
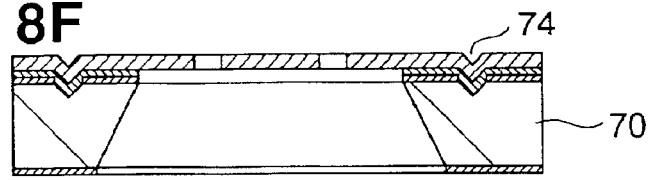

A method of fabricating upper, middle, and lower electrode structures and a method of assembling them and forming an electron optical system array will be described with reference to FIGS. 8A to 8F, 9A to 9E, and 10. The upper, middle, and lower electrode structures are formed from silicon wafers. Thus, membrane supports are made of silicon. Spacers are formed from glass in which apertures are formed at positions corresponding to the aperture positions of the upper, middle, and lower electrodes. The upper and lower electrode structures typically have the same structure and can be formed by the same method. The fabrication process of the upper electrode structure (lower electrode structure) will be explained with reference to FIGS. 8A to 8F. The upper electrode structure (lower electrode structure) has a silicon membrane support and electrode member 76. A silicon wafer 71 of the <100>orientation plane is prepared as a substrate. A 300-nm thick silicon nitride film is formed on each surface of the silicon wafer 71 by CVD (Chemical Vapor Deposition) (FIG. 8A). By photolithography and etching processes (not shown), these silicon nitride films are removed at a portion serving as electron beam paths and a portion used to align electrodes, thereby forming patterned silicon nitride films 72 and 72'. The silicon substrate is anisotropically etched using the silicon nitride films 72 and 72' as a mask with tetramethylammonium hydroxide solution, thus forming V-shaped grooves (to be referred to as V-grooves 74) in at least one surface of the substrate. The depth of each V-groove 74 is determined by the diameter of a fiber to be used and the distance between electrodes. The used etching solution may be an inorganic alkaline solution such as a potassium hydroxide or sodium hydroxide solution, or an organic alkaline solution such as trimethylmonohydroxyethylammonium hydroxide. Titanium and gold films are successively deposited to film thicknesses of 5 nm and 50 nm as a plating electrode film 75 on the V-grooved surface (FIG. 8B). The titanium film is used within a film thickness of several nm to several hundred nm so as to improve adhesive properties. The conductive gold film is used within several ten nm to several hundred nm. A photoresist pattern is formed at portions serving as apertures 78a by photolithography in the subsequent step, and a Cu electrode member 76 is formed by electroplating. The resist is a novolac-based resist and is 15 µm in thickness. Exposure employs a contact type exposure apparatus using a high-pressure mercury lamp. The electroplating bath contains UBAC#1A (available from EBARA-UDYLITE CO., LTD.) as an acidic copper plating solution. Electroplating is done for 40 min at a plating solution flow rate of 5 L/min, a current density of 7.5 mA/cm$^2$, and a solution temperature of 28° C., and a 10-µm thick copper pattern is buried in the resist pattern gap (FIG. 8C). After that, the resist is removed with a solvent. The electrode member 76 is 10 µm in thickness, and each aperture 78a is 80 µmφ, in diameter. Scribing grooves 77 for cutting an element into a desired size are formed with a dicing saw (FIG. 8D). The element must be cut into a proper size in accordance with the design of the electron optical system of an electron beam exposure apparatus. After the element is fabricated, a support for supporting a membrane is completed by cutting it from the silicon wafer at the positions of the scribing grooves 77. The scribing grooves 77 can be formed using a device such as a dicing saw or laser cutter used in a semiconductor manufacturing process. The plated surface is protected with polyimide (not shown), and the silicon substrate is etched from the other surface at 90° C. by using a 22% aqueous tetramethylammonium hydroxide solution. Etching is continued until silicon is etched away to expose the silicon nitride film 72'. The substrate is cleaned with water and dried, and the silicon nitride film 72' is etched away by reactive ion etching using $CF_4$. The plating electrode film 75 is removed from the lower surface of the silicon wafer by ion milling using Ar gas, and the polyimide film which protects the other surface is removed by ashing (FIG. 8E). Accordingly, a membrane 78 is formed from the electrode member. The electrode structure is cut from the silicon wafer at the scribing groove formed in the step of FIG. 8D, completing the upper electrode structure (lower electrode structure) made up of the membrane 78 and a support 70 (FIG. 8F).

Figure 9A:
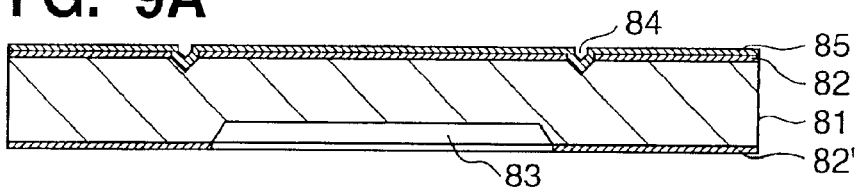
FIGS. 9A to 9E are sectional views for explaining the steps in fabricating a middle electrode.
Figure 9B:
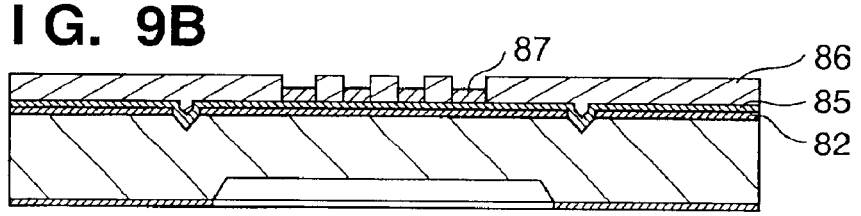
Figure 9C:
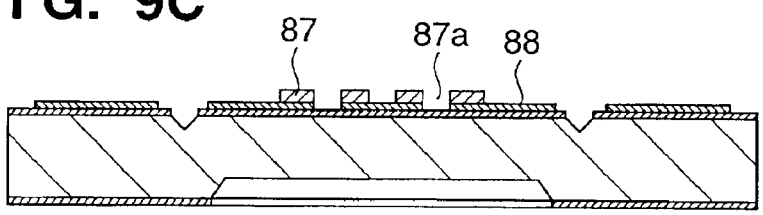
Figure 9D:
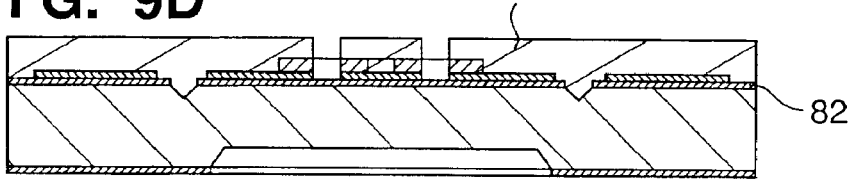

The fabrication process of the middle electrode will be described with reference to FIGS. 9A to 9E. A silicon wafer 81 of the <100>orientation plane is prepared as a substrate. A 1-µm thick silicon nitride film is formed on each surface of the silicon wafer 81 by CVD. By resist and etching processes (not shown), these silicon nitride films are removed at a portion serving as electron beam paths and a portion used to align electrodes, thereby forming patterned silicon nitride films 82 and 82'. The silicon substrate is anisotropically etched using the silicon nitride films 82 and 82' as a mask with a tetramethylammonium hydroxide solution, thus forming V-shaped grooves (to be referred to as V-grooves 84) in at least one surface of the substrate. The depth of each V-groove 84 is determined by the diameter of a fiber to be used and the distance between electrodes. Titanium and gold films are successively deposited to film thicknesses of 5 nm and 50 nm as a plating electrode film 85 on the V-grooved surface 84. This vapor deposition method is a resistance heating method as one of vacuum film formation methods (FIG. 9A). Then, a resist pattern 86 serving as a plating mold is formed on the electrode, and Cu electrode members 87 are formed by electroplating. The resist is a novolac-based resist and is 15 µm in thickness. Exposure employs a contact type exposure apparatus using a high-pressure mercury lamp. The electroplating bath contains UBAC#1A (available from EBARA-UDYLITE CO., LTD.) as an acidic copper plating solution. Electroplating is done for 40 min at a plating solution flow rate of 5 L/min, a current density of 7.5 mA/cm$^2$, and a solution temperature of 28° C., and a 10 µm thick copper pattern is buried in the resist pattern gap. After that, the resist is removed with a solvent. The upper electrode layer is 10 µm in thickness, and the electrode members 87 corresponding to the electrode members 5 in FIG. 2 are completed (FIG. 9B). Each aperture 87a is 80 µm in diameter. The plating electrode film 85 is patterned by photolithography and etching processes to form wiring lines 88 corresponding to the wiring lines 7 in FIG. 2 (FIG. 9C). The plated surface except for the apertures 87a of the electrode members 87 is protected with a polyimide film 90 (FIG. 9D). The silicon substrate is etched back from the other surface at 90° C. by using a 22% tetramethylammonium hydroxide solution. Etching is continued until silicon is etched away to expose the silicon nitride film 82.

The silicon nitride film 82 exposed in the apertures 87a is etched from the plated surface by reactive ion etching using $CF_4$ gas. The polyimide film 90 which protects the other surface is removed by ashing, thus completing a middle electrode structure having a support 80 and a membrane 89 with the electrode members 87, wiring lines 88, and silicon nitride film 82 (FIG. 9E).

The spacer fabrication method is as follows. The spacer is made of photosensitive glass. The glass thickness is 100 μm which is determined in accordance with each of the gaps between the upper, middle, and lower electrode structures required to be used as an electron lens. The outer size is set to fall within the membrane formed by etching the silicon wafer from its lower surface. Portions serving apertures are irradiated with ultraviolet rays by using a photomask as a light-shielding mask, developing annealing is performed at 590° C. for 45 min, and apertures are formed with a 5% hydrofluoric acid solution.

Figure 9E:
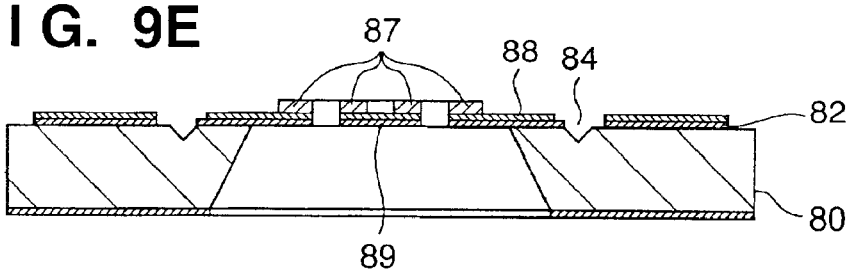

The electron optical system array shown in FIG. 1 is formed such that the upper electrode structure (30 in FIG. 1) and lower electrode structure (10 in FIG. 1) shown in FIG. 8F, and the middle electrode structure (20 in FIG. 1) shown in FIG. 9E which are fabricated by the above methods are stacked along the optical axis via the spacers 4 and 6. In this electron optical system array, the substrate does not warp even if a stress is applied to the electrode member having a plurality of apertures in fixing the membrane support of the electrode in the electron beam exposure apparatus. Moreover, the spacer can determine the distance between the electrode structures even if the membrane formed from the electrode layer warps owing to the internal stress. This can prevent any difference in generated electrolytic potential depending on the position of a lens in the array owing to warp. The distance between the electrode members can be constant within the membrane, and generation of discharge can be suppressed.

Figure 10:
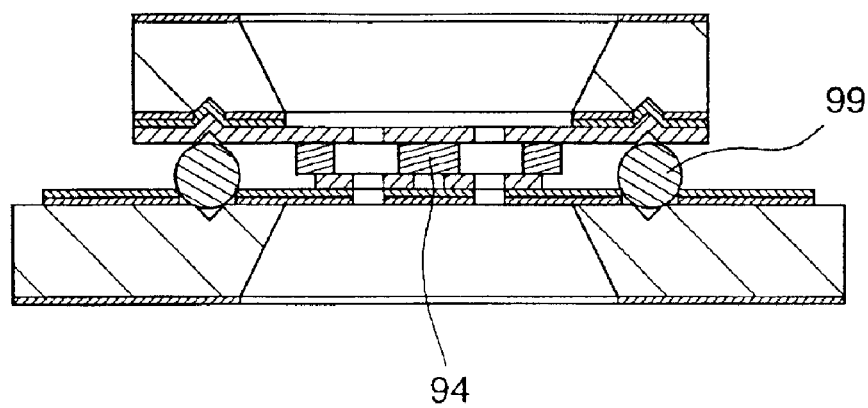
FIG. 10 is a sectional view for explaining the joining method of the electron optical system array.

A method of fabricating the electron optical system array shown in FIG. 6 will be described with reference to FIGS. 8F, 9E, and 10. FIG. 10 shows a more detailed arrangement of the electron optical system array shown in FIG. 6. After fibers 99 are placed in the V-grooves 84 of the electrode structure shown in FIG. 9E, a spacer 94 is placed on the membrane 89, and the electrode structure shown in FIG. 8F is turned over and placed on the spacer 94 so as to make the V-grooves 74 coincide with the V-grooves 84. An adhesive is applied to the V-grooves holding the fibers and hardened to form an electron lens from the two electrodes shown in FIGS. 6 and 10. The gap between the membrane supports of the electrodes is determined by the diameter of the fiber 99 set in the V-grooves. The gap between the membranes is determined by the spacer 94.

<Electron Beam Exposure Apparatus>

Figure 11:
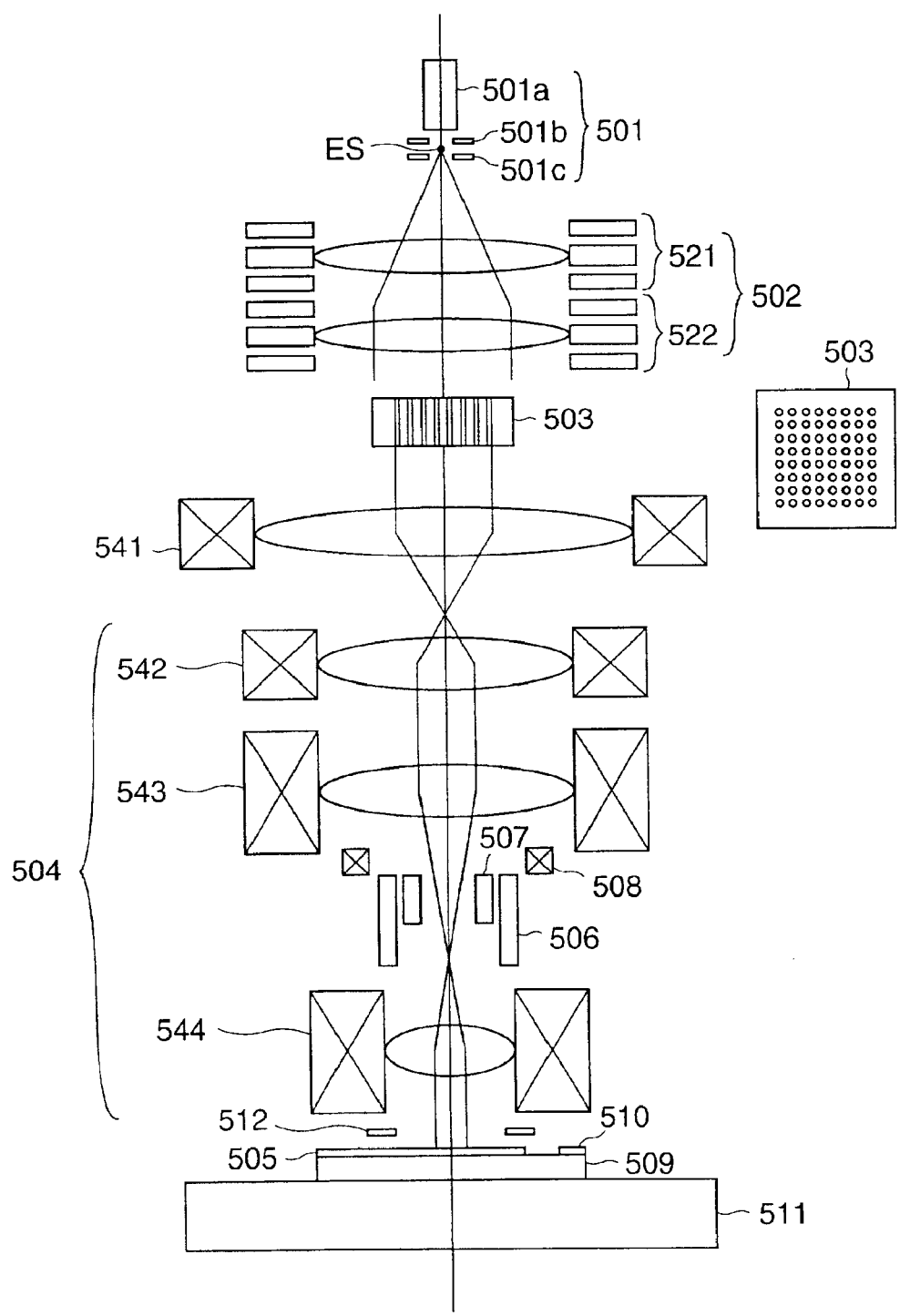
FIG. 11 is a view showing an entire multi-beam exposure apparatus.

A multi-beam charged-particle exposure apparatus (electron beam exposure apparatus) will be exemplified as a system using an electron optical system arrays as described in the above embodiments. FIG. 11 is a schematic view showing the overall system. In FIG. 11, an electron gun 501 as a charged-particle source is constituted by a cathode 501a, grid 501b, and anode 501c. Electrons emitted by the cathode 501a form a crossover image (to be referred to as an electron source ES hereinafter) between the grid 501b and the anode 501c. An electron beam emitted by the electron source ES irradiates a correction electron optical system 503 via an irradiation electron optical system 502 serving as a condenser lens. The irradiation electron optical system 502 is comprised of electron lenses (unipotential lenses) 521 and 522 each having three aperture electrodes. The correction electron optical system 503 is an application of the electron optical system array as described in each of the above embodiments, and forms a plurality of intermediate images of the electron source ES (details of the structure will be described later). The correction electron optical system 503 adjusts the formation positions of intermediate images so as to correct the influence of aberration of a projection electron optical system 504. Each intermediate image formed by the correction electron optical system 503 is reduced and projected by the projection electron optical system 504, and forms an image of the electron source ES on a wafer 505 as a surface to be exposed. The projection electron optical system 504 is constituted by a symmetrical magnetic doublet made up of a first projection lens 541 (543) and second projection lens 542 (544). Reference numeral 506 denotes a deflector for deflecting a plurality of electron beams from the correction electron optical system 503 and simultaneously displacing a plurality of electron source images on the wafer 505 in the X and Y directions; 507, a dynamic focus coil for correcting a shift in the focal position of an electron source image caused by deflection aberration generated when the deflector 506 operates; 508, a dynamic stigmatic coil for correcting astigmatism among deflection aberrations generated by deflection; 509, a θ-Z stage which supports the wafer 505, is movable in the optical axis AX (Z-axis) direction and the rotational direction around the Z-axis, and has a stage reference plate 510 fixed thereto; 511, an X-Y stage which supports the θ-z stage and is movable in the X and Y directions perpendicular to the optical axis AX (Z-axis); and 512, a reflected-electron detector for detecting reflected electrons generated upon irradiating a mark on the stage reference plate 510 with an electron beam.

Figure 12A:
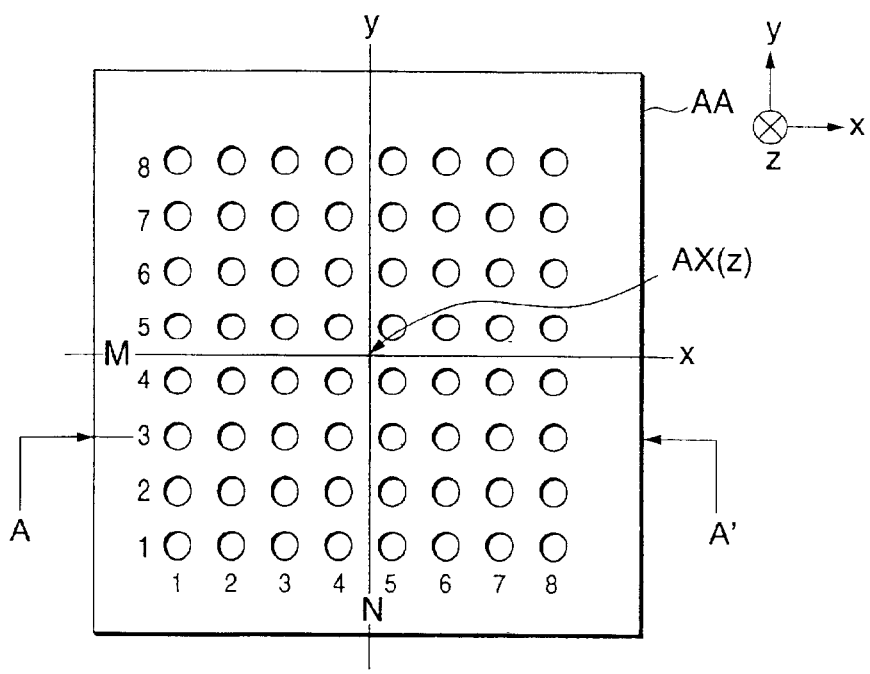
FIGS. 12A and 12B are views for explaining details of a correction electron optical system.
Figure 12B:
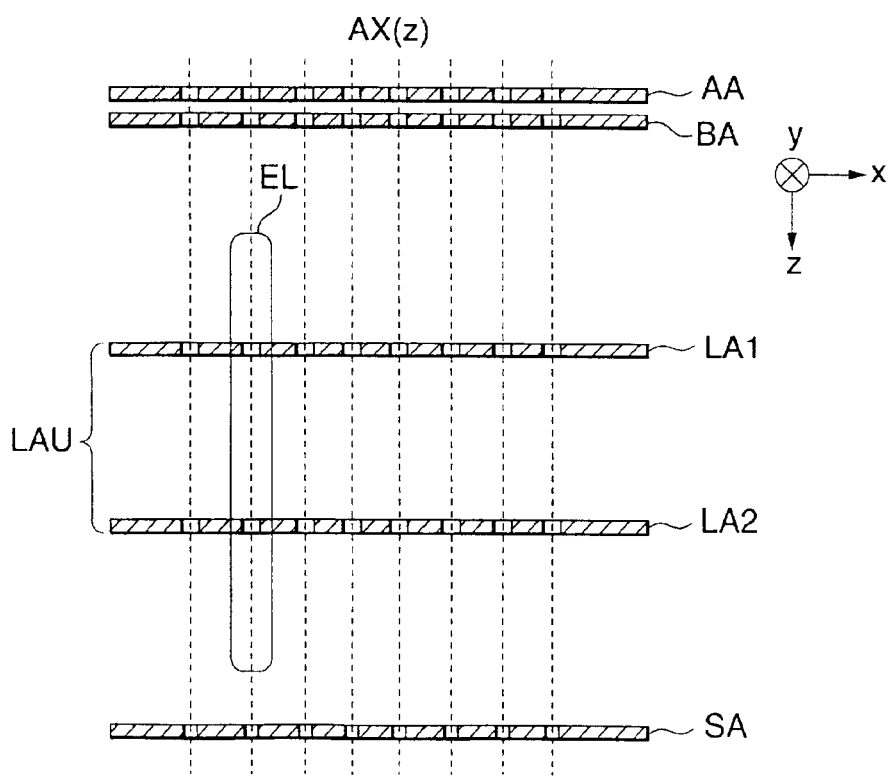

FIGS. 12A and 12B are views for explaining details of the correction electron optical system 503. The correction electron optical system 503 comprises an aperture array AA, blanker array BA, element electron optical system array unit LAU, and stopper array SA along the optical axis. FIG. 12A is a view of the correction electron optical system 503 when viewed from the electron gun 501, and FIG. 12B is a sectional view taken along the line A–A' in FIG. 12A. As shown in FIG. 12A, the aperture array AA has an array (8×8) of apertures regularly formed in a substrate, and splits an incident electron beam into a plurality of (64) electron beams. The blanker array BA is constituted by forming on one substrate a plurality of deflectors for individually deflecting a plurality of electron beams split by the aperture array AA. The element electrooptic electron optical system array unit LAU is formed from first and second electron optical system arrays LA1 and LA2 as electron lens arrays each prepared by two-dimensionally arraying a plurality of electron lens on the same plane. The electron optical system arrays LA1 and LA2 employ an application of the structure described in the above embodiments to an 8×8 array, and are fabricated by the above-mentioned method. The element electron optical system array unit LAU constitutes one element electron optical system EL by the electron lenses of the first and second electron optical system arrays LA1 and LA2 that use the common X-Y coordinate system. The stopper array SA has a plurality of apertures formed in a substrate, similar to the aperture array AA. Only a beam deflected by the blanker array BA is shielded by the stopper array SA, and ON/OFF operation of an incident beam to the wafer 505 is switched for each beam under the control of the blanker array.

Since the charged-particle beam exposure apparatus of this embodiment adopts an excellent electron optical system array as described above for the correction electron optical system, an apparatus having a very high exposure precision can be provided and can increase the integration degree of a device to be manufactured in comparison with the prior art.

<Example of Semiconductor Production System>

A production system for a semiconductor device (semiconductor chip such as an IC or LSI, liquid crystal panel, CCD, thin-film magnetic head, micromachine, or the like) using the exposure apparatus will be exemplified. A trouble remedy or periodic maintenance of a manufacturing apparatus installed in a semiconductor manufacturing factory, or maintenance service such as software distribution is performed by using a computer network outside the manufacturing factory.

Figure 13:
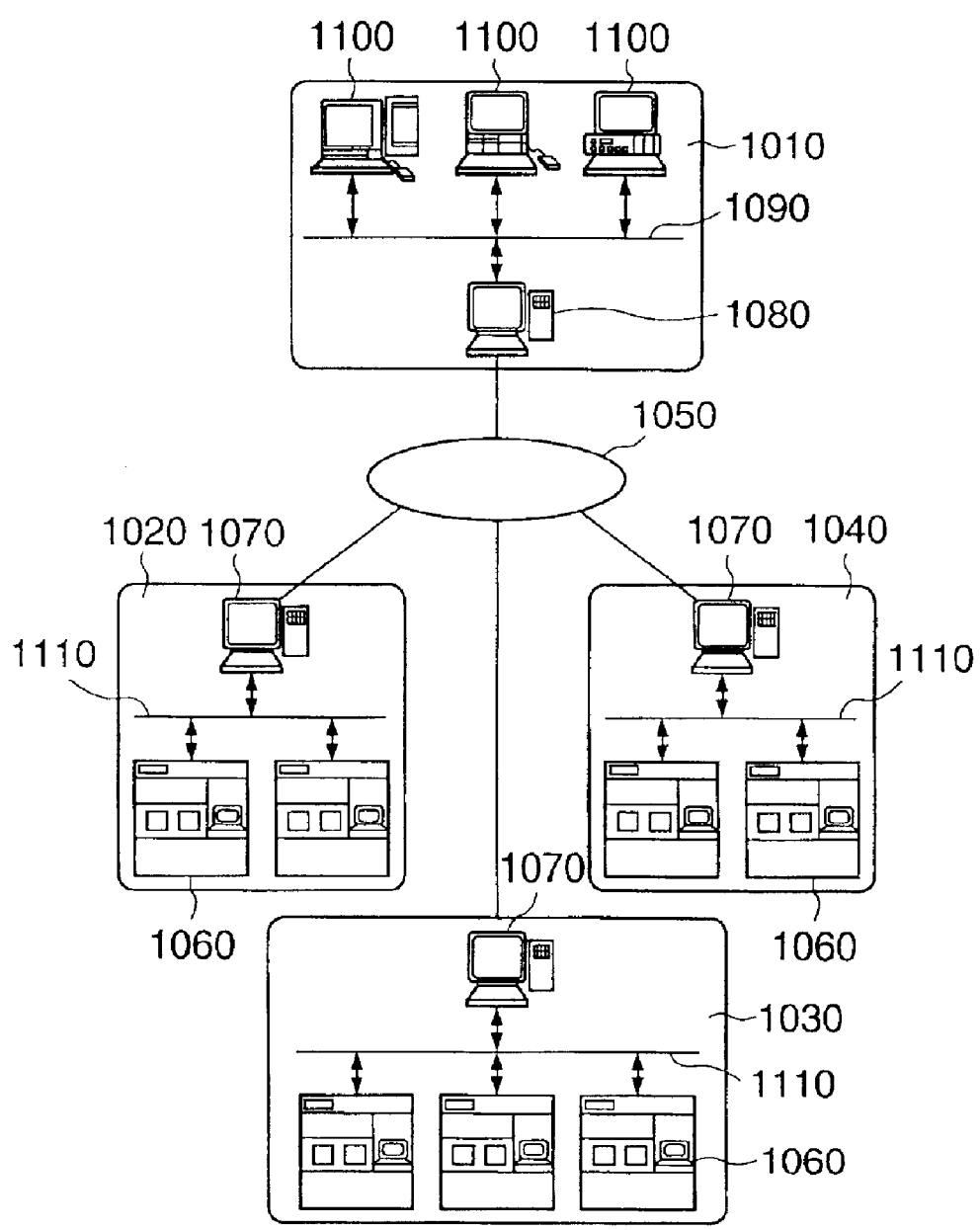
FIG. 13 is a view showing the concept of a semiconductor device production system when viewed from a given angle.

FIG. 13 shows the overall system cut out at a given angle. In FIG. 13, reference numeral 1010 denotes a business office of a vendor (apparatus supply manufacturer) which provides a semiconductor device manufacturing apparatus. Assumed examples of the manufacturing apparatus are semiconductor manufacturing apparatuses for various processes used in a semiconductor manufacturing factory, such as pre-process apparatuses (lithography apparatus including an exposure apparatus, resist processing apparatus, and etching apparatus, annealing apparatus, film formation apparatus, planarization apparatus, and the like) and post-process apparatuses (assembly apparatus, inspection apparatus, and the like). The business office 1010 comprises a host management system 1080 for providing a maintenance database for the manufacturing apparatus, a plurality of operation terminal computers 1100, and a LAN (Local Area Network) 1090 which connects the host management system 1080 and computers 1100 to construct an intranet. The host management system 1080 has a gateway for connecting the LAN 1090 to Internet 1050 as an external network of the business office, and a security function for limiting external accesses.

Reference numerals 1020 to 1040 denote manufacturing factories of the semiconductor manufacturer as users of manufacturing apparatuses. The manufacturing factories 1020 to 1040 may belong to different manufacturers or the same manufacturer (pre-process factory, post-process factory, and the like). Each of the factories 1020 to 1040 is equipped with a plurality of manufacturing apparatuses 1060, a LAN (Local Area Network) 1110 which connects these apparatuses 1060 to construct an intranet, and a host management system 1070 serving as a monitoring apparatus for monitoring the operation status of each manufacturing apparatus 1060. The host management system 1070 in each of the factories 1020 to 1040 has a gateway for connecting the LAN 1110 in the factory to the Internet 1050 as an external network of the factory. Each factory can access the host management system 1080 of the vender 1010 from the LAN 1110 via the Internet 1050. Typically, the security function of the host management system 1080 authorizes access of only a limited user to the host management system 1080.

In this system, the factory notifies the vender via the Internet 1050 of status information (e.g., the symptom of a manufacturing apparatus in trouble) representing the operation status of each manufacturing apparatus 1060. The vender transmits, to the factory, response information (e.g., information designating a remedy against the trouble, or remedy software or data) corresponding to the notification, or maintenance information such as the latest software or help information. Data communication between the factories 1020 to 1040 and the vender 1010 and data communication via the LAN 1110 in each factory typically adopt a communication protocol (TCP/IP) generally used in the Internet. Instead of using the Internet as an external network of the factory, a dedicated-line network (e.g., ISDN) having high security which inhibits access of a third party can be adopted. It is also possible that the user constructs a database in addition to one provided by the vendor and sets the database on an external network and that the host management system authorizes access to the database from a plurality of user factories.

Figure 14:
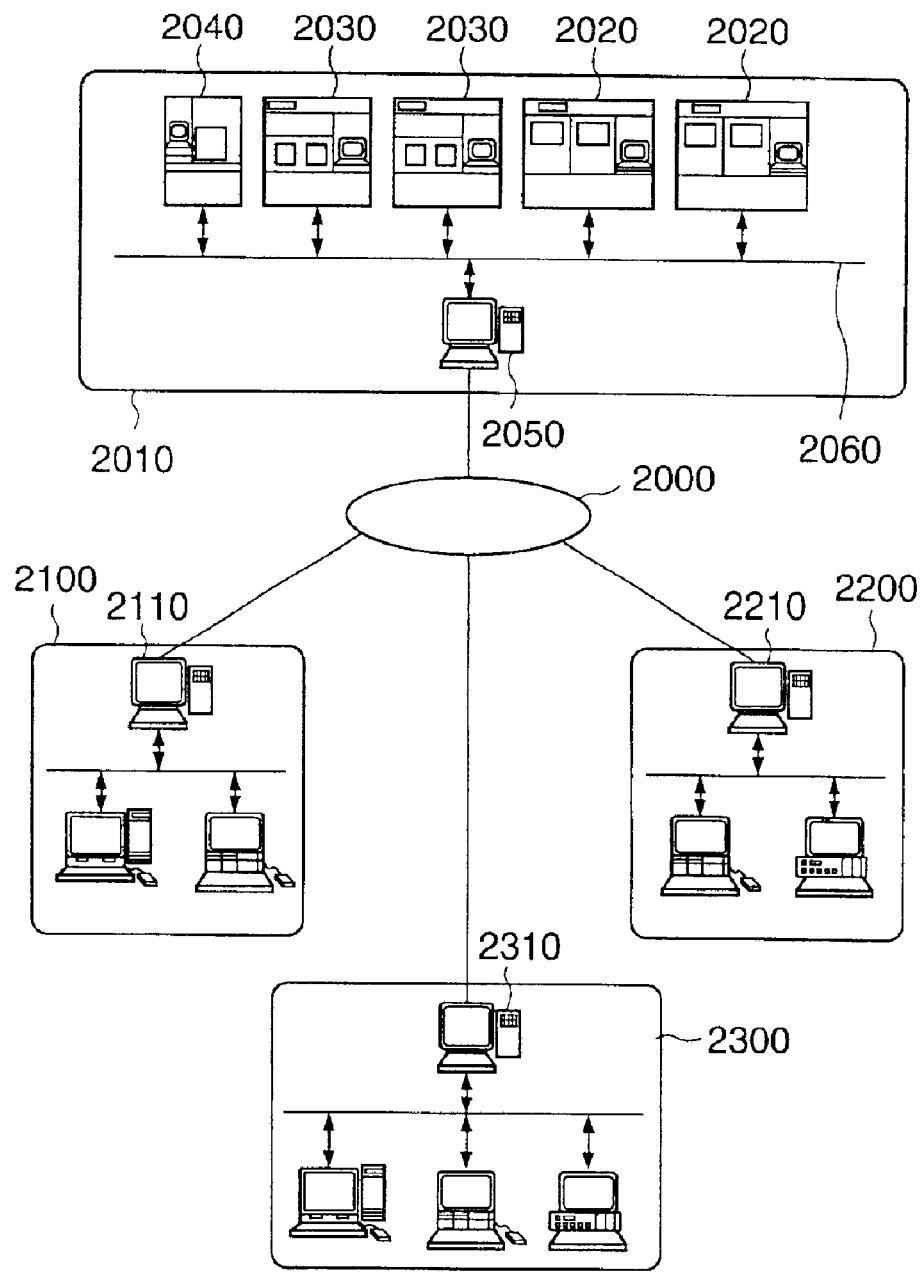
FIG. 14 is a view showing the concept of the semiconductor device production system when viewed from another angle.

FIG. 14 is a view showing the concept of the overall system of this embodiment that is cut out at a different angle from FIG. 13. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 14, a factory having a plurality of manufacturing apparatuses of a plurality of vendors, and the management systems of the vendors for these manufacturing apparatuses are connected via the external network of the factory, and maintenance information of each manufacturing apparatus is communicated. In FIG. 14, reference numeral 2010 denotes a manufacturing factory of a manufacturing apparatus user (semiconductor device manufacturer) where manufacturing apparatuses for various processes, e.g., an exposure apparatus 2020, resist processing apparatus 2030, and film formation apparatus 2040 are installed in the manufacturing line of the factory.

FIG. 14 shows only one manufacturing factory 2010, but a plurality of factories are networked in practice.

The respective apparatuses in the factory are connected to a LAN 2060 to construct an intranet, and a host management system 2050 manages the operation of the manufacturing line. The business offices of vendors (apparatus supply manufacturers) such as an exposure apparatus manufacturer 2100, resist processing apparatus manufacturer 2200, and film formation apparatus manufacturer 2300 comprise host management systems 2110, 2210, and 2310 for executing remote maintenance for the supplied apparatuses. Each host management system has a maintenance database and a gateway for an external network, as described above. The host management system 2050 for managing the apparatuses in the manufacturing factory of the user, and the management systems 2110, 2210, and 2310 of the vendors for the respective apparatuses are connected via the Internet or dedicated-line network serving as an external network 2000. If a trouble occurs in any one of a series of manufacturing apparatuses along the manufacturing line in this system, the operation of the manufacturing line stops. This trouble can be quickly solved by remote maintenance from the vendor of the apparatus in trouble via the external network 2000. This can minimize the stop of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 15 on the display. While referring to this window, the operator who manages manufacturing apparatuses in each factory inputs, in input items on the windows, pieces of information such as the type of manufacturing apparatus (4010), serial number (4020), subject of trouble (4030), occurrence date (4040), degree of urgency (4050), symptom (4060), remedy (4070), and progress (4080). The pieces of input information are transmitted to the maintenance database via the Internet, and appropriate maintenance information is sent back from maintenance database and displayed on the display. The user interface provided by the web browser realizes hyperlink functions (4100 to 4120), as shown in FIG. 15. This allows the operator to access detailed information of each item, receive the latest-version software to be used for a manufacturing apparatus from a software library provided by a vendor, and., receive an operation guide (help information) as a reference for the operator in the factory.

A semiconductor device manufacturing process using the above-described production system will be explained. FIG. 16 shows the flow of the whole manufacturing process of the semiconductor device. In step 1 (circuit design), a semiconductor device circuit is designed. In step 2 (creation of exposure control data), exposure control data of the exposure apparatus is created based on the designed circuit pattern. In step 3 (wafer manufacture), a wafer is manufactured using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process may be performed in separate dedicated factories. In this case, maintenance is done for each of the factories by the above-described remote maintenance system. Information for production management and apparatus maintenance is communicated between the pre-process factory and the post-process factory via the Internet or dedicated-line network.

Figure 17:
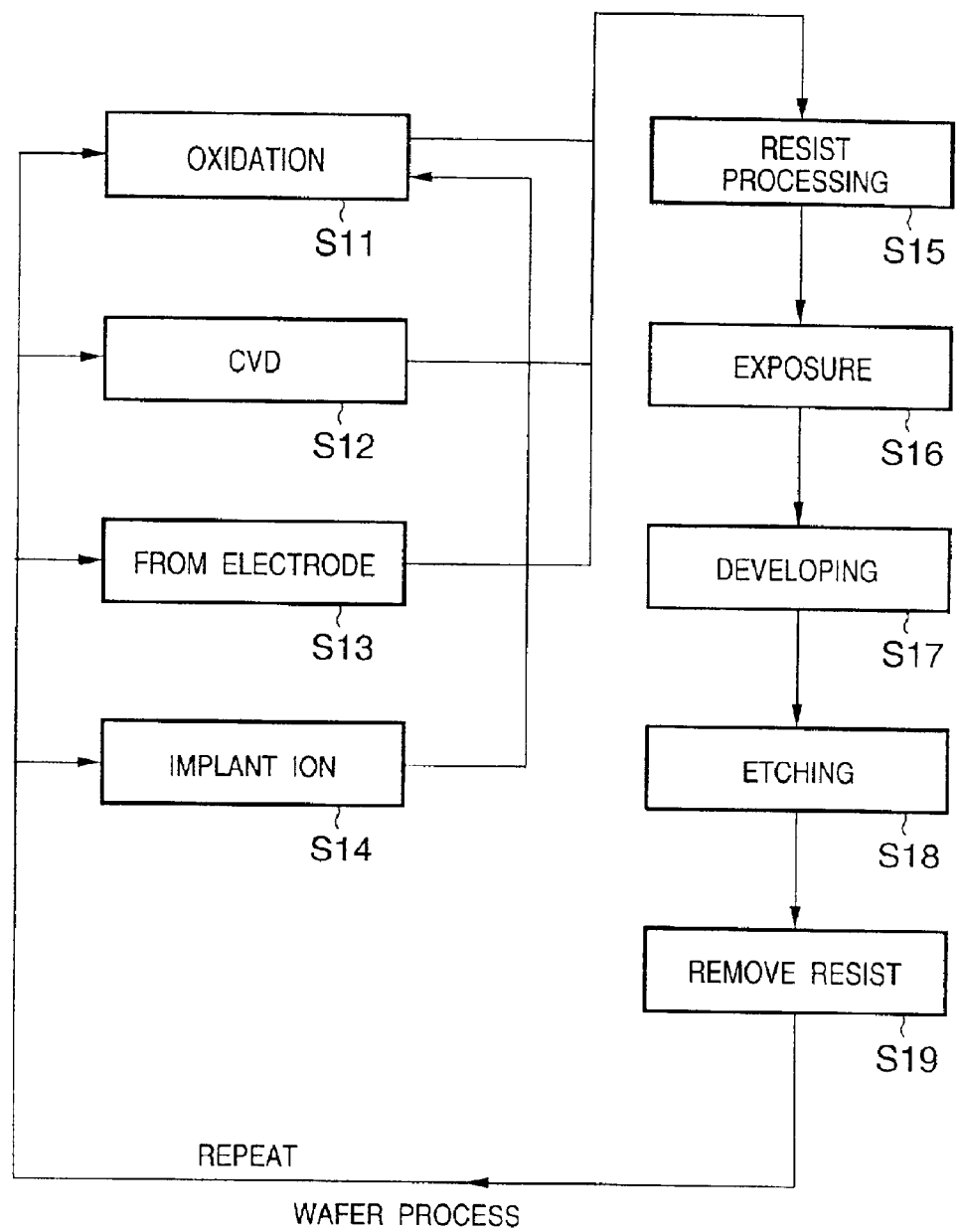
FIG. 17 is a flow chart for explaining details of a wafer process.

FIG. 17 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus draws (exposes) a circuit pattern on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents a trouble in advance. Even if a trouble occurs, the manufacturing apparatus can be quickly recovered. The productivity of the semiconductor device can be increased in comparison with the prior art.

According to the present invention, the gap between facing membranes holding the electrodes of an electron optical system array can be maintained at a high precision by interposing a spacer between them. The present invention can satisfy both high precision and high reliability at high level. An exposure apparatus constituted using this electron optical system can produce a device at a high precision.

As many apparently widely different embodiments of the present invention can be made without departing from the spirit and scope thereof, it is to be understood that the invention is not limited to the specific embodiments thereof except as defined in the appended claims.

What is claimed is:

1. An electron optical system array having a plurality of electron lenses, comprising:
   at least two electrode structures which respectively include membranes and are arranged along an optical axis, each of the membranes having a plurality of apertures through which charged-particle beams pass; and
   a spacer which is interposed between the facing membranes and adjacent to the apertures and which determines a gap between the facing membranes.

2. The array according to claim 1, wherein said spacer includes an insulator.

3. The array according to claim 1, wherein said spacer is made of photosensitive glass.

4. The array according to claim 1, wherein said spacer is arranged at a position where said spacer does not close the apertures of each membrane.

5. The array according to claim 1, wherein said spacer includes a plate having a plurality of apertures at positions corresponding to the plurality of apertures of each membrane.

6. The array according to claim 1, wherein
   said spacer includes a plurality of members having apertures, and
   the plurality of members are arranged to make positions of the apertures of the plurality of members coincide with positions of the plurality of apertures of each membrane.

7. The array according to claim 1, wherein at least one of said at least two electrode structures comprises:
   a plurality of electrically independent wiring lines; and
   a plurality of electrode members connected to the plurality of wiring lines.

8. The array according to claim 1, wherein at least one of said at least two electrode structures has a single electrode member common to the plurality of apertures.

9. The array according to claim 1, wherein the electrode structures respectively have supports for supporting the membranes.

10. The array according to claim 9, further comprising a member which is interposed between the supports of said facing electrode structures and determines a gap between the facing supports.

11. The array according to claim 9, wherein
   the supports of said facing electrode structures respectively have grooves at facing positions, and
   the electron optical system array further comprises a fiber which is between the facing grooves and defines a gap between the facing supports.

12. The array according to claim 1, wherein said spacer is arranged at a position between the neighboring apertures.

13. An electron optical system array having a plurality of electron lenses, comprising:
   at least two electrode structures which respectively include membranes and are arranged along an optical axis, each of the membranes having a plurality of apertures through which charged-particle beams pass; and
   a plurality of spacers which are located in a gap of the facing membranes and adjacent to the apertures and which determine the gap at a plurality of positions of the facing membranes.

14. The array according to claim 13, wherein each of said plurality of spacers includes a columnar member.

15. The array according to claim 13, wherein each of said plurality of spacers includes a linear number.

16. The array according to claim 13, wherein each of said plurality of spacers has a dice shape.

17. The array according to claim 13, wherein each of said plurality of spacers has a cylindrical shape having a second aperture, an axis of the second aperture according with that of the aperture of each membrane.

18. The system according to claim 13, wherein each of said plurality of spacers is arranged at a position between the neighboring apertures.

19. A charged-particle beam exposing apparatus comprising:
a charged-particle beam source for emitting a charged-particle beam;
an electron optical system array which has a plurality of electron lenses and forms a plurality of intermediate images of said charged-particle beam source by the plurality of electron lenses; and
a projection electron optical system for projecting on a substrate the plurality of intermediate images formed by said electron optical system array,
said electron optical system array including:
at least two electrode structures which respectively include membranes and are arranged along an optical axis, each of the membranes having a plurality of apertures through which charged-particle beams pass; and
a spacer which is interposed between the facing membranes and adjacent to the aperture and which determines a gap between the facing membranes.

20. A device manufacturing method comprising the steps of:
installing a plurality of semiconductor manufacturing apparatuses including a charged-particle beam exposure apparatus in a factory; and
manufacturing a semiconductor device by using the plurality of semiconductor manufacturing apparatuses,
the charged-particle beam exposure apparatus having:
a charged-particle beam source for emitting a charged-particle beam;
an electron optical system array which has a plurality of electron lenses and forms a plurality of intermediate images of the charged-particle beam source by the plurality of electron lenses; and
a projection electron optical system for projecting on a substrate the plurality of intermediate images formed by the electron optical system array,
the electron optical system array including:
at least two electrode structures which respectively include membranes and are arranged along an optical axis, each of the membranes having a plurality of apertures through which charged-particle beams pass; and
a spacer which is interposed between the facing membranes and adjacent to the apertures and which determines a gap between the facing membranes.

21. The method according to claim 20, further comprising the steps of:
connecting the plurality of semiconductor manufacturing apparatuses by a local area network;
connecting the local area network to an external network of the factory;
acquiring information about the charged-particle beam exposure apparatus from a database on the external network by using the local area network and the external network; and
controlling the charged-particle beam exposure apparatus on the basis of the acquired information.

22. A semiconductor manufacturing factory comprising:
a plurality of semiconductor manufacturing apparatuses including a charged-particle beam exposure apparatus;
a local area network for connecting said plurality of semiconductor manufacturing apparatuses; and
a gateway for connecting the local area network to an external network of said semiconductor manufacturing factory,
said charged-particle beam exposure apparatus having:
a charged-particle beam source for emitting a charged-particle beam;
an electron optical system array which has a plurality of electron lenses and forms a plurality of intermediate images of said charged-particle beam source by the plurality of electron lenses; and
a projection electron optical system for projecting on a substrate the plurality of intermediate images formed by said electron optical system array,
said electron optical system array including:
at least two electrode structures which respectively include membranes and are arrange along an optical axis, each of the membranes having a plurality of apertures through which charged-particle beams pass; and
a spacer which is interposed between the facing membranes and adjacent to the apertures and which determines a gap between the facing membranes.

23. A maintenance method for a charged-particle beam exposure apparatus, comprising the steps of:
preparing a database for storing information about maintenance of the charged-particle beam exposure apparatus on an external network of a factory where the charged-particle beam exposure apparatus is installed;
connecting the charged-particle beam exposure apparatus to a local area network in the factory; and
maintaining the charged-particle beam exposure apparatus on the basis of the information stored in the database by using the external network and the local area network,
the charged-particle beam exposure apparatus having:
a charged-particle beam exposure source for emitting a charged-particle beam;
an electron optical system array which has a plurality of electron lenses and forms a plurality of intermediate images of the charged-particle beam source by the plurality of electron lenses; and
a projection electron optical system for projecting on a substrate the plurality of intermediate images formed by the electron optical system array,
the electron optical system array including:
at least two electrode structures which respectively include membranes and are arranged along an optical axis, each of the membranes having a plurality of apertures through which charged-particle beams pass; and
a spacer which is interposed between the facing membranes and adjacent to the aperture and which determines a gap between the facing membranes.

24. An electron optical system array having a plurality of electron lenses, the array comprising:

at least two electrode structures respectively including membranes and supports, each of the membranes including a first region having a plurality of apertures through which charged-particle beams pass and a second region surrounding the first region, the supports arranged to support the second regions of the membranes, the at least two electrodes structures arranged along paths of the charged-particle beams; and a spacer interposed between the first regions of the facing membranes and determining a gap between the facing membranes.

25. A charged-particle beam exposure apparatus comprising:

a charged-particle beam source for emitting a charged-particle beam;

an electron optical system array which has a plurality of electron lenses and forms a plurality of intermediated images of said charged-particle beam source by the plurality of electron lenses; and a projection electron optical for projecting on a substrate the plurality of intermediate image formed by said electron optical array, said electron optical system array including:

at least two electrode structures respectively including membranes and supports, each of the membranes including a first region having a plurality of apertures through which charged-particle beams pass and a second region surrounding the first region, the supports arranged to support the second regions of the membranes, the at least two electrode structures arranged along paths of the charged-particle beams; and a spacer interposed between the first regions of the facing membranes and determining a gap between the facing membranes.

26. A device manufacturing method comprising the steps of:

installing a plurality of semiconductor manufacturing apparatuses including a charged-particle beam exposure apparatus in a factory; and manufacturing a semiconductor device by using the plurality of semiconductor manufacturing apparatuses, the charged-particle beam exposure apparatus having:

a charged-particle beam source for emitting a charged-particle beam;

an electron optical system array which has a plurality of electron lenses and forms a plurality of intermediate images of the charged-particle beam source by the plurality of electron lenses; and a projection electron optical system for projecting on a substrate the plurality of intermediated images formed by the electron optical array, the electron optical system array including:

at least two electrode structure respectively including membranes and supports, each of the membranes including a first region having a plurality of apertures through which charged-particle beams pass and a second region surrounding the first region, the supports arranged to support the second regions of the membranes, the at least two electrode structures arranged along paths of the charged-particle beams; and a spacer interposed between the first regions of the facing membranes and determining a gap between the facing membranes.

* * * * *

UNITED STATES PATENT AND TRADEMARK OFFICE
CERTIFICATE OF CORRECTION

PATENT NO. : 6,872,951 B2
DATED : March 29, 2005
INVENTOR(S) : Takayuki Yagi et al.

It is certified that error appears in the above-identified patent and that said Letters Patent is hereby corrected as shown below:

Title page,
Item [56], References Cited, OTHER PUBLICATIONS, "Sub-Nanometer" reference, "Minature" should read -- Miniature --.

Column 1,
Line 35, "beams" should read -- beam system --.

Column 2,
Line 21, "suffers" should read -- suffers from --.
Lines 25 and 46, "destruct" should read -- destroy --.
Line 52, "arts." should read -- art. --.

Column 3,
Line 11, "includes" should read -- include --.
Line 50, "dice or" should read -- a die or --.

Column 9,
Line 56, "arrays" should read -- array --.

Column 10,
Line 67, after "excellent", the right margin should be closed up.

Column 11,
Line 17, after "1010", the right margin should be closed up.

Column 12,
Line 30, after "factory.", the right margin should be closed up.
Line 49, "a trouble" should read -- trouble --.

Column 13,
Line 11, "and.," should read -- and --.
Line 55, "a trouble" should read -- trouble --.

Column 15,
Line 4, "number" should read -- member --.
Line 11, "system" should read -- array --.

UNITED STATES PATENT AND TRADEMARK OFFICE
CERTIFICATE OF CORRECTION

PATENT NO. : 6,872,951 B2
DATED : March 29, 2005
INVENTOR(S) : Takayuki Yagi et al.

It is certified that error appears in the above-identified patent and that said Letters Patent is hereby corrected as shown below:

Column 16,
Line 28, "arrange" should read -- arranged --.

Column 17,
Line 9, "electrodes" should read -- electrode --.
Line 20, "intermediated" should read -- intermediate --.
Line 24, "optical" should read -- optical system array --.
Line 25, "image" should read -- images --.

Column 18,
Line 20, "intermediated" should read -- intermediate --.
Line 23, "structure" should read -- structures --.

Signed and Sealed this

Eighth Day of November, 2005

JON W. DUDAS
*Director of the United States Patent and Trademark Office*